United States Patent
Suzuki et al.

[11] Patent Number: 6,021,040
[45] Date of Patent: Feb. 1, 2000

[54] POWER STORAGE DEVICE AND POWER CONVERTER USING SAME

[75] Inventors: Osamu Suzuki; Kaname Sasaki, both of Ibaraki-ken; Heikichi Kuwahara, Tsuchiura; Hirohisa Yamamura, Hitachiota, all of Japan

[73] Assignee: Hitachi, Ltd., Japan

[21] Appl. No.: 09/190,218

[22] Filed: Nov. 13, 1998

[51] Int. Cl.$^7$ .................... H01G 2/08; H01G 2/10
[52] U.S. Cl. ............................... 361/514; 361/517
[58] Field of Search .................... 361/502, 306.1, 361/517, 512, 514, 106, 301.3, 508, 303, 511, 516, 520, 531, 535–538; 257/723, 698, 295; 310/344; 363/141

[56] References Cited

U.S. PATENT DOCUMENTS

| | | | |
|---|---|---|---|
| 3,681,666 | 8/1972 | Bowling | 361/513 |
| 5,796,568 | 8/1998 | Baiatu | 361/106 |
| 5,862,035 | 1/1999 | Farahmandi et al. | 361/502 |
| 5,886,457 | 3/1999 | Maesaka et al. | 310/344 |

FOREIGN PATENT DOCUMENTS 6-45192  2/1994  Japan .

*Primary Examiner*—Dean A. Reichard
*Assistant Examiner*—Anthony Dinkins
*Attorney, Agent, or Firm*—Evenson McKeown Edwards & Lenahan P.L.L.C.

[57] ABSTRACT

A power storage device such as a capacitor, a battery or the like having a power storage element and a case, and a power converter using the power storage device in combination with an invertor circuit. The power storage device including a capacitor, a battery or the like is constructed of a power storage element having an anode foil, a cathode foil and an insulating material, and a highly thermally conductive and electrically conductive case, where an electrode foil of the power storage element is thermally insulated from the case by an insulating material and is in thermal contact with the case. The power storage device and the invertor circuit are arranged in close proximity and in thermal contact with a cooling unit. With this configuration, it is possible to prevent a leak current from flowing into the case to eliminate the generation of noise, maintain the security, and accomplish a longer effective life, a reduced size and a higher capacitance.

5 Claims, 8 Drawing Sheets

POWER STORAGE DEVICE AND POWER CONVERTER USING SAME

BACKGROUND OF THE INVENTION

1. Field of the Invention

The present invention relates to a power storage device and a power converter using same, suitable for use in a power storage device such as a capacitor, a battery or the like which comprises a power storage element and a case, and a power converter which employs the power storage device in combination with an invertor circuit.

2. Description of Related Art

Power storage devices such as a capacitor, a battery or the like are used in electric and/or electronic circuits for storing and supplying electric power. As an example of a conventional power storage device, an aluminum electrolytic capacitor will be described below. The aluminum electrolytic capacitor comprises a wound capacitor element formed of electrodes, a dielectric material and insulating sheets, accommodated in a case, and a lid having electrode terminals connected to the electrodes of the capacitor element. The lid sealingly encloses the capacitor element in the case.

The capacitor, when applied with an alternate current voltage, generates heat since a power loss occurs within the element. In this event, since the capacitor element is more deteriorated as the element itself is heated to higher temperatures, the temperature at the capacitor element must be maintained lower in order to ensure a longer effective life. On the other hand, since the amount of heat generated by a capacitor is proportional to the electric capacitance of the capacitor, a poor cooling capability of the capacitor would result in a shorter effective life thereof. In addition, since a poor cooling capability does not permit a capacitor to have a larger capacitance, the capacitor itself must be increased in size.

As can be seen, for reducing the size of a capacitor, the capacitor must be provide with an improved cooling capability. Other than the capacitor, power storage devices such as a battery or the like also require an improved cooling capability, as is the case of the capacitor, since their power storage elements also generate heat during charging and discharging.

From such a viewpoint, a capacitor described in U.S. Pat. No. 3,681,666, for example, improves the cooling capability by extending a cathode foil of a wound capacitor element and pressing the extended cathode foil into contact with a metal capacitor container.

In the capacitor disclosed in the U.S. Pat. No. 3,681,666, however, since the cathode foil of the capacitor element is extended and directly in contact with the metal capacitor container, a leak current flows through the container itself, thus causing problems such as generation of radio noise, difficulties in maintenance and inspection, and so on. For example, when the disclosed capacitor is used in a power converter for an electric car which includes a semiconductor switching element for a main circuit, a leak current flowing through the capacitor container, if any, would introduce noise into radio waves received from the outside, such as those received by a car-equipped radio. In addition, in maintenance and inspection for the power converter, wherein an operator often touches parts of the power converter by hand for the operation, if a leak current exists in a capacitor container which is a main part, the security must be ensured against the leak current before the maintenance and inspection should be done. In addition, power storage device such as a battery or the like also imply similar problems.

SUMMARY OF THE INVENTION

It is an object of the present invention to provide a power storage device and power converter which are capable of preventing a leak current from flowing through a case to eliminate the introduction of noise, which may cause radio frequency interference in the surroundings, ensuring the security during maintenance and inspection, and maintaining a power storage element at low temperatures, thus accomplishing as a consequence a longer effective life, a reduced size and a higher capacitance.

To achieve the above object, a first feature of the present invention lies in a power storage device which comprises a power storage element having an anode electrode, a cathode electrode, and an insulating material interposed therebetween, and a case for accommodating the power storage element and having good thermal conductivity and electrical conductivity, wherein at least one of the electrodes of the power storage element is electrically insulated from the case and is arranged in thermal contact with the case.

Preferably, the power storage element comprises an anode foil, a cathode foil and an insulating sheet interposed therebetween, the power storage element is formed in a plurality of layers, the case is formed of a metal material, and a highly thermally conductive and electrically insulating member is interposed between the power storage element and the case. Further, the case is formed in a cylindrical or box shape, and the electrically insulating member is formed of a sheet material and disposed on the bottom of the case. Furthermore, the insulating sheet is impregnated with an electrolyte, the case is formed in a cylindrical or box shape, and the electrically insulating member is formed to cover substantially over the entire inner surface of the case.

A second feature of the present invention lies in a power storage device which comprises a power storage device having an anode foil, a cathode foil, and an insulating sheet interposed therebetween, the power storage device being formed in a plurality of layers, and a case for accommodating the power storage element, the case having good thermal conductivity and electrical conductivity, wherein the power storage element has at least one electrode extended, with a leading end of the extended electrode abutting to an electrically insulating member arranged on the bottom of the case, and the electrically insulating member is formed of a highly thermally conductive and elastic material.

Preferably, the storage element is formed in a plurality of layers by piling and winding the anode foil, the cathode foil, and the insulating sheet interposed therebetween, and the electrically insulating member has a thickness of 1.1 mm or less.

A third feature of the present invention lies in a power storage device which a power storage element having an anode foil, a cathode foil, and an insulating sheet interposed therebetween, wherein the power storage device is formed in a plurality of layers by winding the anode foil, the cathode foil, and the insulating sheet a plurality of times, a metal case for accommodating the power storage element and having good thermal conductivity and electrical conductivity, a lid for covering one open surface of the case, and a sheet-like electrically insulating member formed of a highly thermally conductive and elastic material and disposed on the bottom of the case, wherein one end of the cathode foil is extended further than corresponding one end of the anode foil so that the one end abuts to the electrically insulating member, and the power storage element is pressed onto the electrically insulating member by the lid.

A fourth feature of the present invention lies in a power storage device which comprises a power storage element having an anode foil, a cathode foil, and an insulating sheet interposed therebetween, the power storage device being formed in a plurality of layers, and a case for accommodating the power storage element, the case having good thermal conductivity and electrical conductivity, a highly thermally conductive and electronically insulating member arranged on the bottom of the case, wherein the power storage element has at least one electrode extended such that a leading end of the extended electrode abuts to the insulating member, and a heat sink arranged outside of the bottom surface of the case in thermal contact therewith.

A fifth feature of the present invention lies in a power storage device which comprises a power storage element having an anode, a cathode, and an insulating material interposed therebetween, and a case for accommodating the power storage element, wherein the case is made of a highly thermally conductive and electrically insulating material, and the power storage element has at least one electrode arranged in thermal contact with the case.

A sixth feature of the present invention lies in a power converter which comprises a power storage device having a storage element and a case, an invertor circuit coupled to the power storage device as an input power supply for controlling the rotation of a motor, wherein the storage device is formed of an anode foil, a cathode foil, and an insulating sheet interposed therebetween and arranged in a plurality of layers, the case accommodates the power storage element and has good thermal conductivity and electrical conductivity, the power storage element has at least one of its electrodes being electrically insulated from the case and arranged in thermal contact with the case, and the power storage device and the invertor circuit are positioned in proximity, and a heat sink arranged in thermal contact with both the power storage device and the invertor circuit.

Preferably, the heat sink is formed with a cooling fluid path at least in a portion thermally contacted with the invertor circuit and in a portion thermally contacted with the power storage device, and supplied with a cooling fluid from the side where the heat sink is in thermal contact with the invertor circuit. Also, the power storage device is installed on a side wall surface adjacent to a bottom surface on which the invertor circuit is installed, and an electrode terminal arranged on one side of the power storage device is positioned in close proximity to the invertor circuit.

In the power storage device and the power converter using same as described above, since at least one electrode of the power storage element is arranged electrically insulated from and thermally contacted with the case, it is possible to prevent a leak current as well as effectively dissipate heat generated by the power storage element from the case, thereby maintaining the power storage element at low temperatures. Also, since the case is formed of a metal material and the highly thermally conductive and electrically insulating member is interposed between the power storage element and the case, higher heat dissipating performance of the case can be ensured for dissipating heat from the outer surface thereof, as compared with a power storage device having an electrically insulating member arranged outside of a case, since heat dissipated from the outer surface of the case is not blocked by the electrically insulating member. Since the highly thermally conductive insulating member formed of a sheet material is arranged on the bottom of the case, an electrically insulating property and thermal transfer performance can be provided between the power storage element and the case with a simple construction. Further, since the case is made of a metal material, and the insulating member is formed to substantially cover the entire inner surface of the case, short-circuiting between the case and an electrode can be prevented without fail by the insulating member even if a conductive electrolyte impregnated in the insulating sheet oozes into the case, while ensuring that heat is dissipated from the outer surface of the case.

Furthermore, since the electrically insulating member, to which an end portion of an electrode abuts, is formed of an elastic material, a good thermal contact can be ensured between the electrode and the case even if the extended electrode protruding from the edge of the plurality of layers causes a ragged configuration, which can be absorbed by the elasticity of the electrically insulating member, thereby making it possible to maintain the power storage element at lower temperatures. Also, since the thickness of the electrically insulating member is chosen to be 1.1 mm or less, the thermal resistance from the end portion of the electrode to the case through the electrically insulating member can be made smaller than that without the electrically insulating member, thus making it possible to improve thermal transfer performance.

Moreover, at least one of the electrodes of the power storage element is extended so that the end of the extended electrode abuts to the highly thermally conductive and electrically insulating member arranged on the bottom of the case, and the heat sink is arranged outside of the bottom surface of the case in thermal contact therewith, so that heat transferred from the power storage element to the bottom of the case can be immediately cooled by the heat sink, thus providing excellent cooling performance.

The power converter is constructed such that the power storage element has at least one electrode arranged electrically insulated from and thermally contacted with the case, the power storage device and the invertor circuit are positioned in close proximity, and the heat sink is arranged in thermal contact with both the power storage device and the invertor circuit, so that the power storage device and the invertor circuit can be effectively cooled, and the heat sink can be made simpler in construction. In addition, since the closely positioned power storage device and invertor circuit require shorter lengths of wires, a reduction in inductance can also be accomplished. Further, the heat sink is formed with the cooling fluid path at least in a portion thermally contacted with the invertor circuit and in a portion thermally contacted with the power storage device, and supplied with a cooling fluid from the side where the heat sink is in thermal contact with the power storage device, so that the power storage device and the invertor circuit can be more effectively cooled. On top of that, the invertor circuit can be cooled with priority, thus improving the reliability. Furthermore, the power storage device is installed on the side wall surface adjacent to the bottom surface on which the invertor circuit is installed, and an electrode terminal arranged on one side of the power storage device is positioned in close proximity to the invertor circuit, so that wires for connecting the power storage device with the invertor circuit can be made shorter, thereby further reducing the inductance.

DESCRIPTION OF THE PREFERRED EMBODIMENTS

Figure 1:
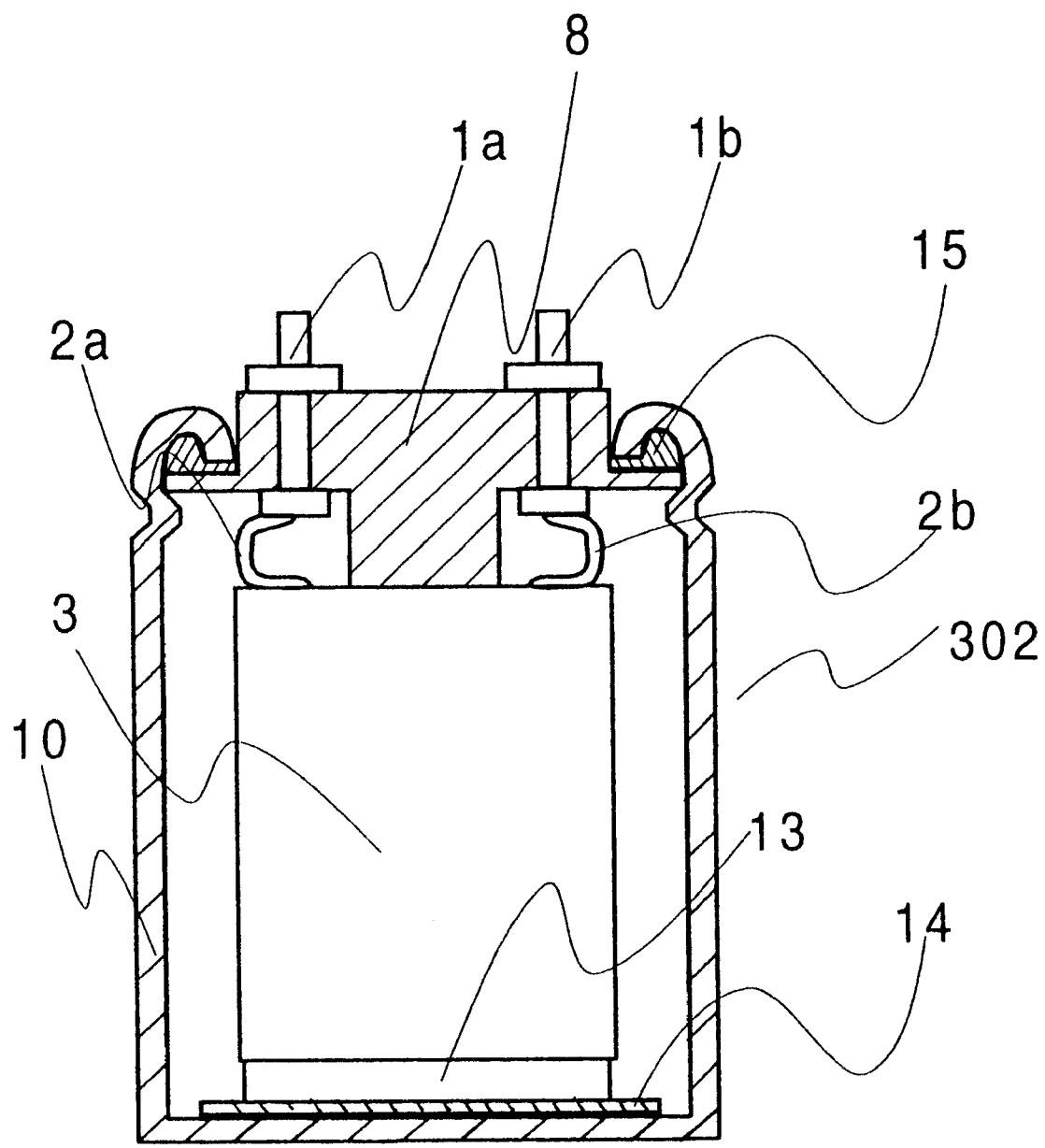
FIG. 1 is a vertical cross-sectional view illustrating a first embodiment of a capacitor according to the present invention.

A power storage device and a power converter according to the present invention will hereinafter be described with regard to respective embodiments thereof with reference to the accompanying drawings. In the drawings of the respective embodiments, the same reference numerals designate the same or corresponding parts, and repetitive description will be omitted.

Figure 2:
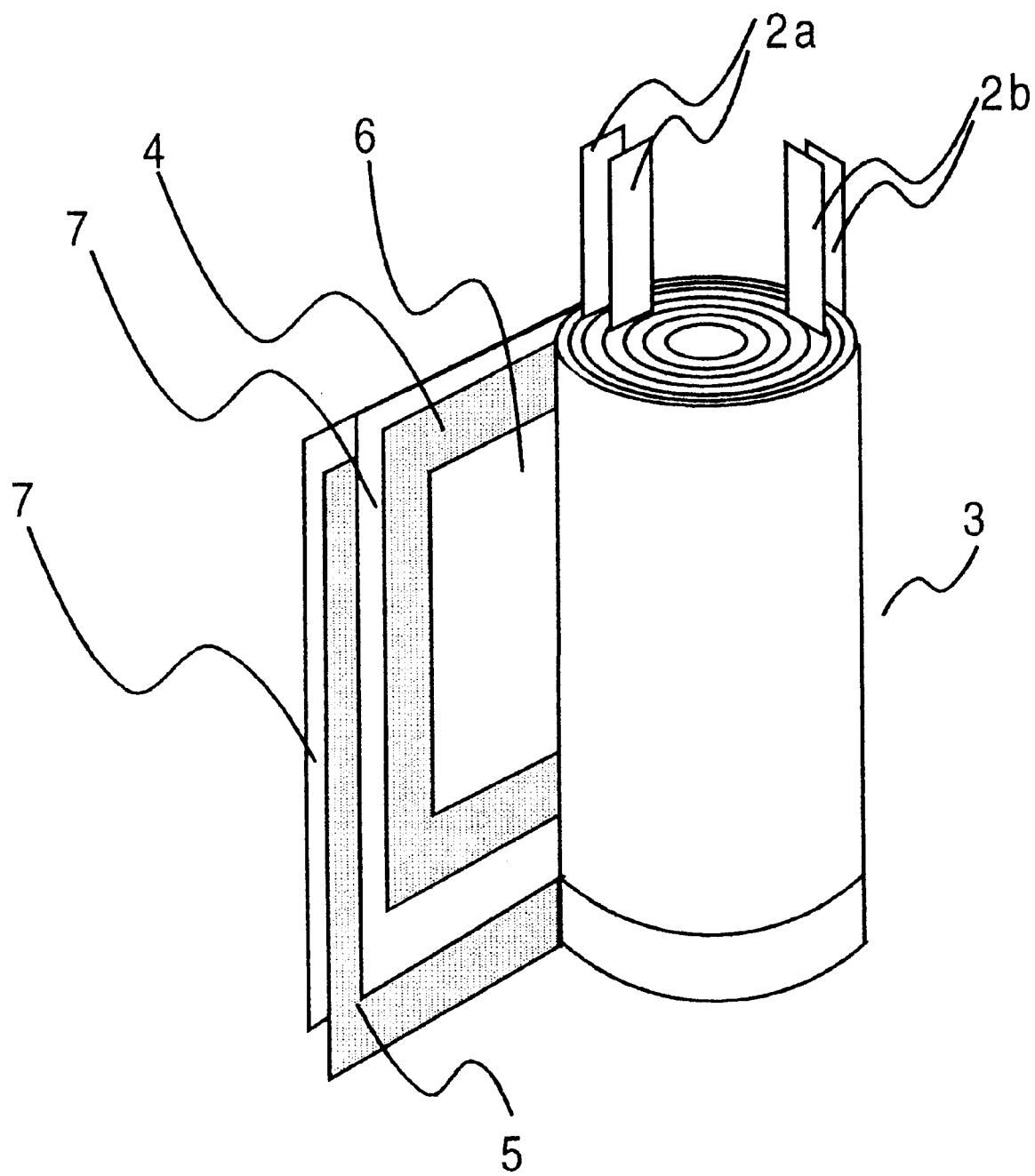
FIG. 2 is a partially exploded perspective view of a capacitor element used in the capacitor of FIG. 1 for clarifying the construction.
Figure 3:
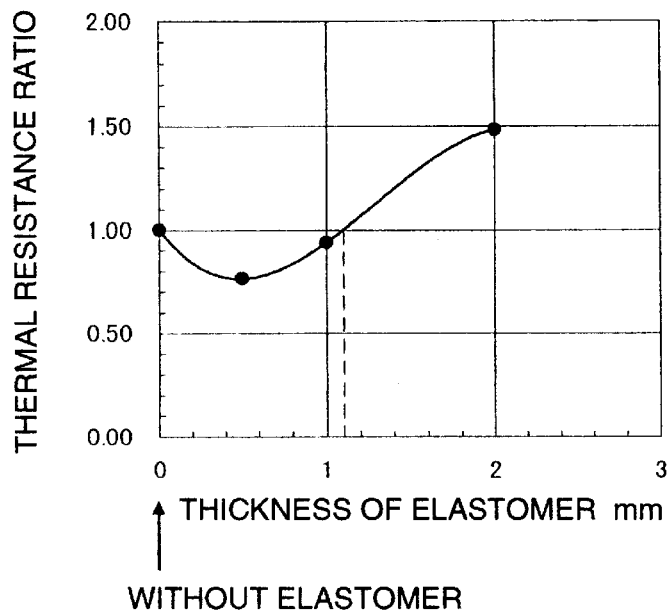
FIG. 3 shows a characteristic graph of the thermal resistance ratio with respect to the thickness of an insulating member used in the capacitor illustrated in FIG. 1.

In the following, a first embodiment of a power storage device according to the present invention will be described with reference to FIGS. 1 to 3. FIG. 1 is a vertical cross-sectional view illustrating the first embodiment of a capacitor according to the present invention; FIG. 2 is a partially exploded perspective view of a capacitor element used in the capacitor of FIG. 1 for clarifying the construction thereof; and FIG. 3 shows a characteristic graph of the thermal resistance ratio with respect to the thickness of an insulating member of the capacitor illustrated in FIG. 1.

A capacitor 302 serving as a power storage device comprises a capacitor element 3 serving as a power storage element; a metal capacitor case 10 for accommodating the capacitor element 3; an upper lid 8 for covering a top opening of the capacitor case 10; electrode terminals 1a, 1b formed through the upper lid 8; current leads 2a, 2b for connecting the electrode terminals 1a, 1b with the capacitor element 3; an electrical insulating member 14 interposed between a lower end of the capacitor element 3 and an inner bottom surface of the capacitor case 10; and so on. The capacitor element 3, which is of a wound type, is formed of a tape-like cathode foil 5, insulating sheets 7, an anode foil 4, and a dielectric material 6 formed on a surface of the anode foil 4, all of which are wound a plurality of times to form a plurality of layers. In the aluminum electrolytic capacitor of this embodiment, the anode foil 4 and the cathode foil 5 are both made of aluminum, and an alumina film is formed as the dielectric material 6 by chemical treatment or the like. The insulating sheets 7 are impregnated with an electrolyte such that the electrolyte chemically reacts with the alumina film to generate a gas during conduction.

The cathode foil 5 has one side, more specifically, a lower end generally extending from the capacitor element 3 toward the bottom of the capacitor case 10. On the other end opposite to this end, the electrode leads 2a, 2b are formed partially protruding therefrom. An extended portion of the cathode foil 5 is placed on the bottom of the capacitor case 10 in contact with an insulating member 14. In this event, the upper lid 8 of the capacitor case 10 is fixed to the capacitor case 10 so as to press the capacitor element 3 against the insulating member 14, so that the one end of the capacitor element 3 is well in thermal contact with the insulating member 14. In addition, a sealing material 15 is inserted between the capacitor case 10 and the upper lid 8 to maintain an air-tight sealing configuration within the capacitor case 10. As mentioned above, a gas is generated in the capacitor case 10 to cause an increase in inner pressure. For this reason, the upper lid 8 or the capacitor case 10 is provided with an explosion-proof valve (not shown) for discharging the internally generated gas therethrough to the outside when the inner pressure increases to a predetermined value or more. The insulating member 14 has not only a good electric insulating property but also a good thermal conductivity, and moreover is made of an elastic material. For example, the insulating member 14 may be made of soft silicon elastomer filled with aluminum oxide particles. When the capacitor element 3 is formed into a cylinder shape by winding its constituents multiple times, for example, as is the case of the first embodiment, the portion of the cathode foil 5 extending from one end of the capacitor element 3 does not match in shape with the insulating member 14 due to its ragged configuration, thereby possibly preventing the cathode foil 5 from sufficiently getting in thermal contact with the insulating member 14. To eliminate this defect, the insulating member 14 is made of a soft elastomer material in order to absorb the ragged configuration of the cathode foil 5 to increase a contact area between the insulating film and the cathode foil 5. In this way, it is possible to reduce a contact thermal resistance at contacting portions of the respective parts by adding a pressing force. As a result, the heat generated from the capacitor element 3 efficiently transfers through the highly thermally conductive cathode foil 5 and insulating member 14 to the capacitor case 10, thus improving the heat dissipation capability of the capacitor 302. Simultaneously, since the insulating member 14 is inserted between the capacitor element 3 and the capacitor case 10, this provides a construction which can readily prevent a leak current from flowing into the capacitor case 10, thus making it possible to eliminate the introduction of noise into radio waves received, for example, by a radio equipped in an electric car.

Results of an experiment for finding the relationship between the thickness and thermal resistance of the insulating member 14 will be explained with reference to FIG. 3. In this experiment, the cathode foil 5 of the capacitor element 3 has a thickness of 0.05 mm, a total thickness of the cathode foil 5, the anode foil 4, and the two insulating sheets 7 amounts to 0.33 mm, and a pressing force of 0.1 MPa is applied. On the other hand, the elastomer contains silicon as a main component, and has a thermal conductivity of 0.8 W/mK. The graph illustrating the results of the experiment is drawn in the following manner. First, the value of the thermal resistance when the insulating member 14 is not used is assumed as one (1.00) and plotted on the line indicating the thickness of 0 mm. Then, the thermal resistance ratio of the elastomer sheet to the case where the elastomer sheet is not used is plotted as the thickness of the elastomer sheet is increased. Thus, the graph indicates the ratio of the thermal resistance for each thickness of the insulating member 14 to the thermal resistance without the elastomer sheet which is defined as one. It can be seen from the graph that the effect of the inserted insulating member 14 is produced in a range of the thickness of the insulating member 14 not more than 1.1 mm. This range of thickness is such that the cathode foil 5 is absorbed by the softness of the insulating member 14 itself, and indicates that a gap between the bottom of the capacitor case 10 and the capacitor element 3 is sufficiently reduced.

Figure 4:
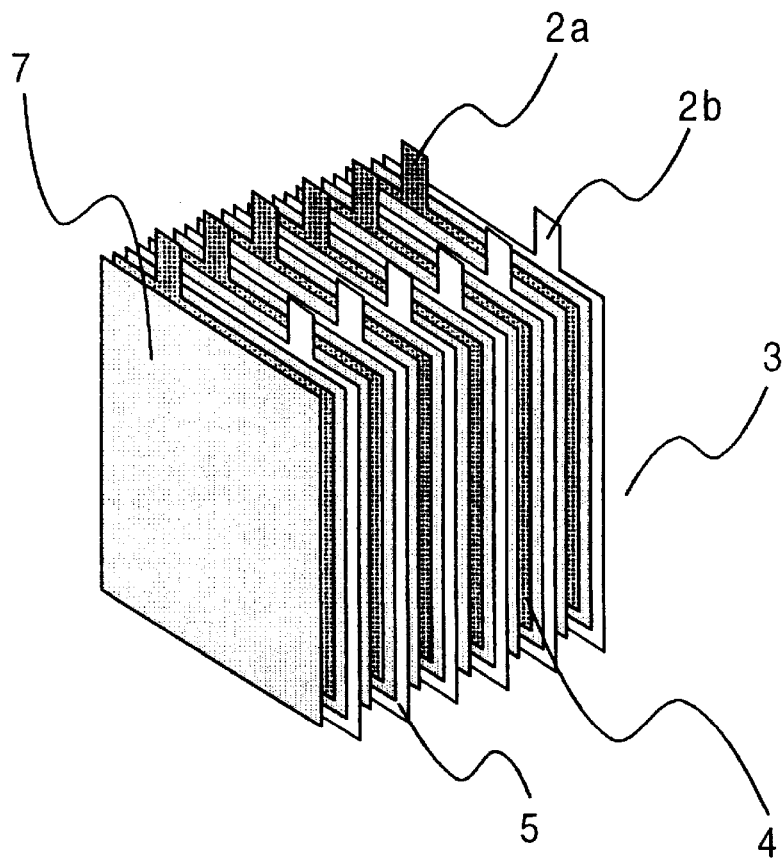
FIG. 4 is an exploded perspective view illustrating a capacitor element in a second embodiment of the capacitor according to the present invention for clarifying the construction thereof.

Next, a second embodiment of the power storage device according to the present invention will be described with reference to FIG. 4. FIG. 4 is an exploded perspective view illustrating a capacitor element in a second embodiment of the capacitor according to the present invention for clarifying the construction thereof. In the second embodiment, the capacitor element 3 is formed in a layered structure in order to improve its mounting efficiency and productivity. Each cathode foil 5 has one end, more specifically, a lower end generally extending from the capacitor element 3 toward the bottom of a capacitor case.

Figure 5:
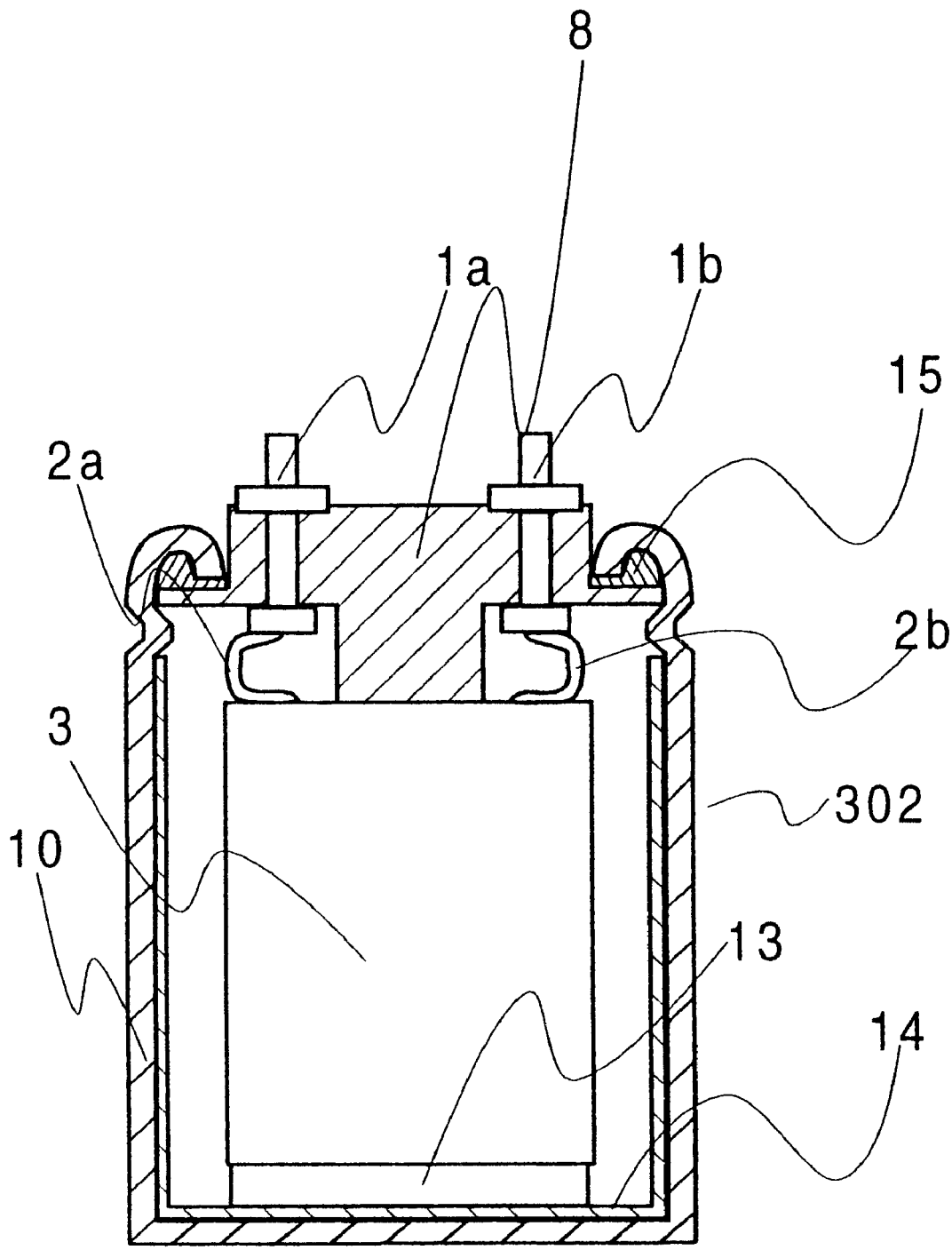
FIG. 5 is a cross-sectional view illustrating a third embodiment of the capacitor according to the present invention.

Next, a third embodiment of the power storage device according to the present invention will be described with reference to FIG. 5. FIG. 5 is a cross-sectional view illustrating a third embodiment of the capacitor according to the present invention. In the third embodiment, an insulating member 14 is arranged to substantially entirely cover the inner surface of a capacitor case 10. In this case, it is contemplated that the insulating member 14 is formed by adhering or coating a tape-like material on the inner surface of the capacitor case 10. With this construction, if an electrolyte impregnated in an insulating sheet 7 oozes into the capacitor case 10, the electrolyte itself having an electrically conductive property serves to short-circuit with the capacitor case 10 to prevent the generation of a leak current. It should be noted that in FIG. 5, the insulating member 14 is not formed in an upper portion of the capacitor case 10 since it is assumed that the power storage device is installed such that electrode terminals 1a, 1b are located on the top. However, if it is assumed that the power storage device is installed with the electrode terminals 1a, 1b located on the side surface or on the lower surface of the capacitor case 10, the insulating member 14 is desirably formed over the entire inner surface of the capacitor case 10.

Figure 6:
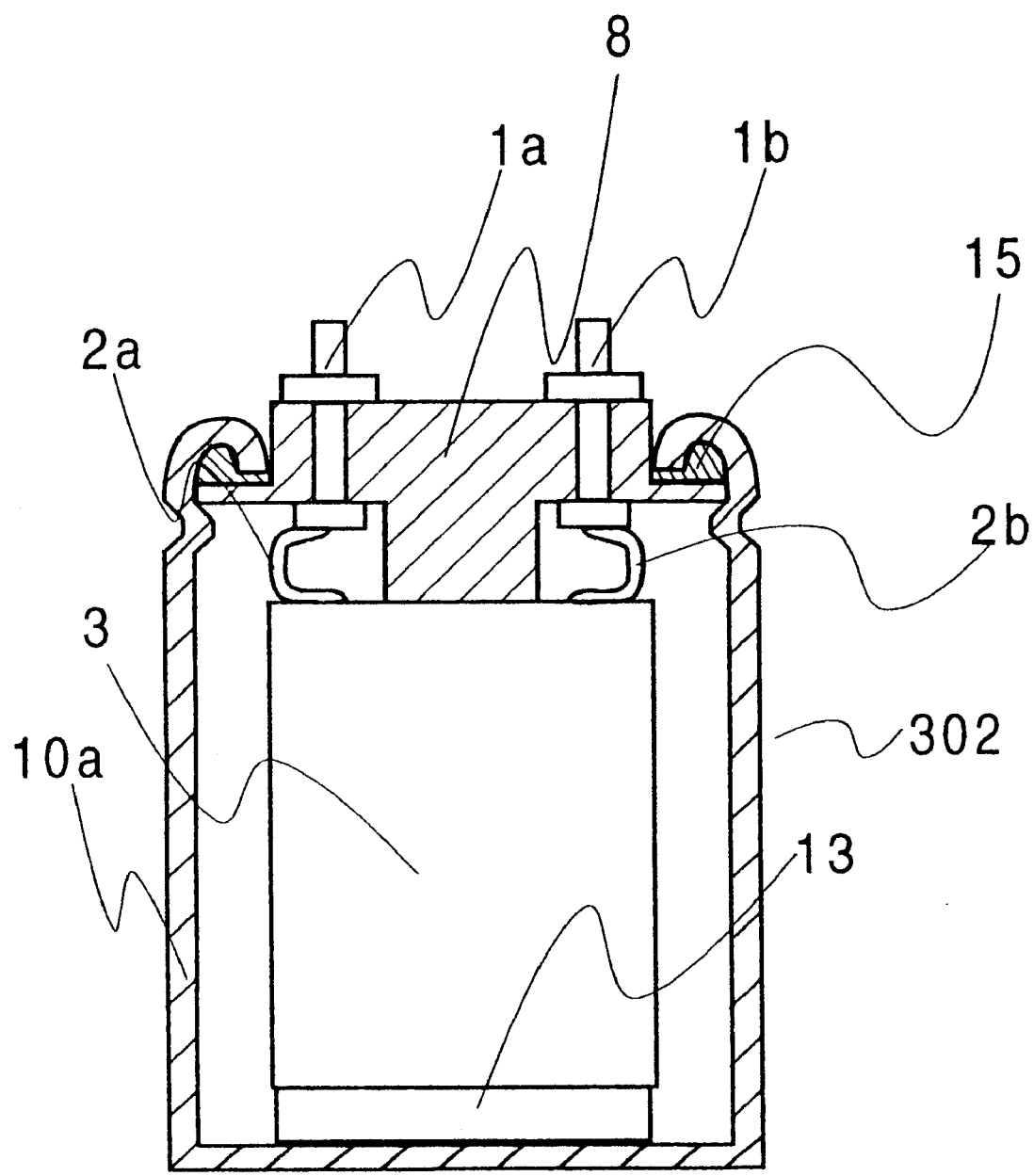
FIG. 6 is a cross-sectional view illustrating a fourth embodiment of the capacitor according to the present invention.

Next, a fourth embodiment of the power storage device according to the present invention will be described with reference to FIG. 6. FIG. 6 is a cross-sectional view illustrating a fourth embodiment of a capacitor according to the present invention. In the fourth embodiment, a capacitor case 10a itself is constructed as a good thermally conductive and electrically insulating member. In this construction, the capacitor case 10a is free from a leak current, and also insulated from the outside.

Figure 7:
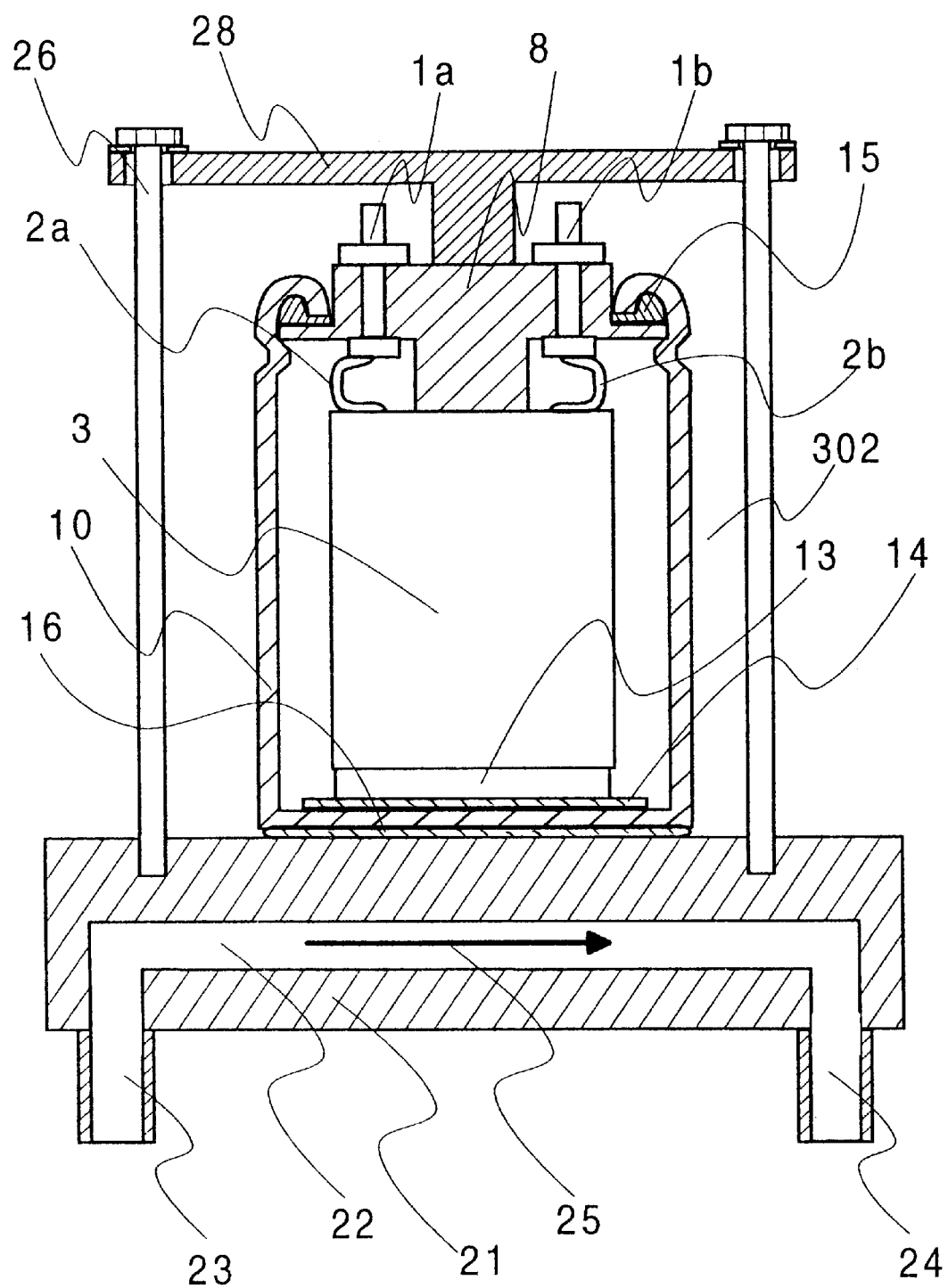
FIG. 7 is a cross-sectional view illustrating a fifth embodiment of the capacitor according to the present invention.

Next, a fifth embodiment of the power storage device according to the present invention will be described with reference to FIG. 7. FIG. 7 is a cross-sectional view illustrating a fifth embodiment of the capacitor according to the present invention. In the fifth embodiment, a capacitor 302 is provided with a cooling unit for efficiently dissipating heat generated from a capacitor element 3. A pressing member 28 is placed in contact with the top surface of an upper lid 8 of the capacitor 302, and secured by bolts 26 screwed into a heat sink 21 so as to be pressed onto the upper lid 8. In this way, a capacitor case 10 is pressed toward the liquid cooling heat sink 21. A thermally conductive grease 16 is interposed between the bottom surface of the capacitor case 10 and the liquid cooling heat sink 21 to provide good thermal transfer performance. The liquid cooling heat sink 21 comprises a liquid inlet pipe 23, an outlet pipe 24, and a liquid flow path 22 serving as a heat transfer surface. With this construction, heat generated from the capacitor element 3 is transferred to the bottom of the capacitor case 10 through an electrically insulating member 14, efficiently transferred from the bottom surface of the capacitor case 10 to the liquid cooling heat sink 21 of the cooling unit, and then dissipated into a cooling water. As a modified example of a capacitor mounted on a cooling unit, it is contemplated that a plurality of mounting flanges are secured on a lower portion of the outer peripheral surface of a capacitor case so that the mounting flanges are utilized to mount the capacitor case to a liquid cooling heat sink with bolts.

It is also contemplated as a further embodiment of the present invention that the thickness of the extended portion of the cathode foil is increased to ensure a larger contact area with the insulating member to reduce a reduction in thermal resistance. In this case, the thickness of the extended portion is desirably increased by a thickness corresponding to a total thickness of two insulating sheets and an anode foil.

The protrusion or extended portion of the cathode foil is slightly crushed by a pressure applied when the capacitor is assembled. Here, for improving the planarity of the protrusion of the cathode foil to further reduce the thermal resistance, it is desirable to assemble the capacitor after applying the cathode foil with a pressure larger than what should be applied thereto during the assembly.

It is also contemplated that an adhesive is used as an insulating member, and a cathode foil is pressed into the adhesive such that an extended portion of the cathode foil is embedded into the adhesive, and secured with solidification of the adhesive, thereby increasing a contact area between the cathode foil and insulating member to reduce the thermal resistance.

It is further contemplated that an elastic member is inserted into the capacitor element and the upper lid as means for pressing the capacitor element. With such means, a stable pressure can be applied even if the capacitor element is deformed due to vibrations of or impacts to the device, thus improving the reliability of the device.

Figure 8:
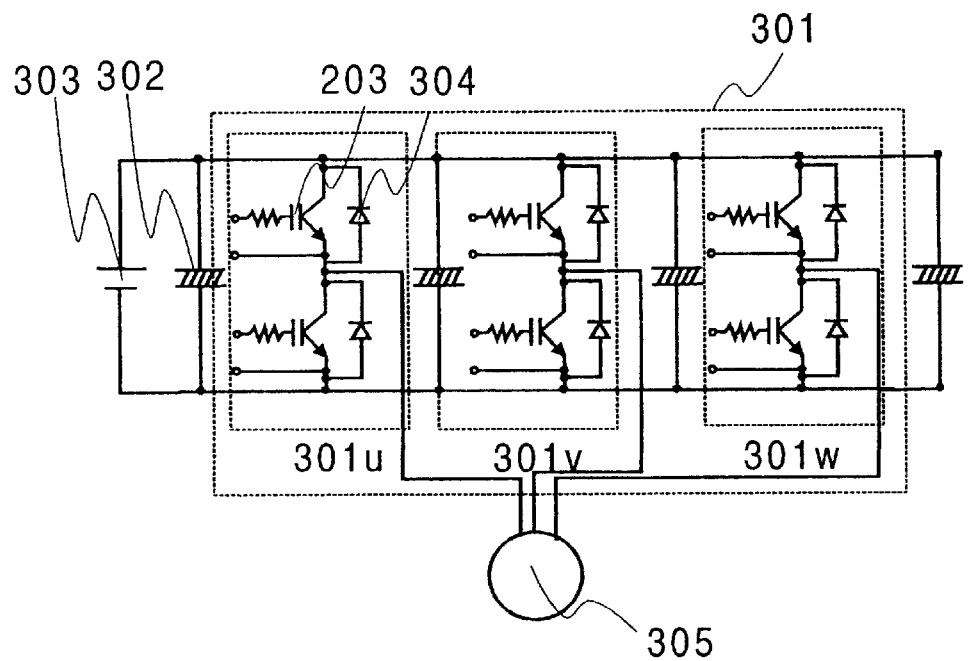
FIG. 8 is a circuit diagram illustrating a first embodiment of a power converter according to the present invention.

Next, a first embodiment of a power converter according to the present invention will be described with reference to FIGS. 8 and 9. FIG. 8 is a circuit diagram illustrating a first embodiment of a power converter according to the present invention, and FIG. 9 is a cross-sectional view illustrating the construction of the power converter including the circuit of FIG. 8.

In FIG. 8, an aluminum electrolytic capacitor 302 according to the present invention and a battery 303 are applied as a power converter for an electric car. This power converter converts a DC current from the battery 303 to a variable voltage and a variable frequency AC current by an invertor circuit 301 to control a three-phase AC motor 305. A filter capacitor 302 is connected to a DC side of each of phases 301u, 301v, 301w of the invertor circuit 301 for removing ripple components from the DC current from the battery 303. Also, a main circuit of the invertor circuit 301 is composed of a semiconductor switching element 203 such as IGBT, by way of example, a free wheel diode 304, and so on. The invertor circuit 301 generates a pulse having three levels, which are positive, negative and neutral levels, from an incoming DC current to output a PWM modulated three-phase AC signal having a variable voltage and a variable frequency. The three-phase motor 305 is controlled its rotation by the variable-voltage and variable-frequency AC signal applied thereto, to force the car to run. During a regeneration period wherein the motor 305 operates as a generator, energy flows into the battery 303 contrarily to the power running period.

Figure 9:
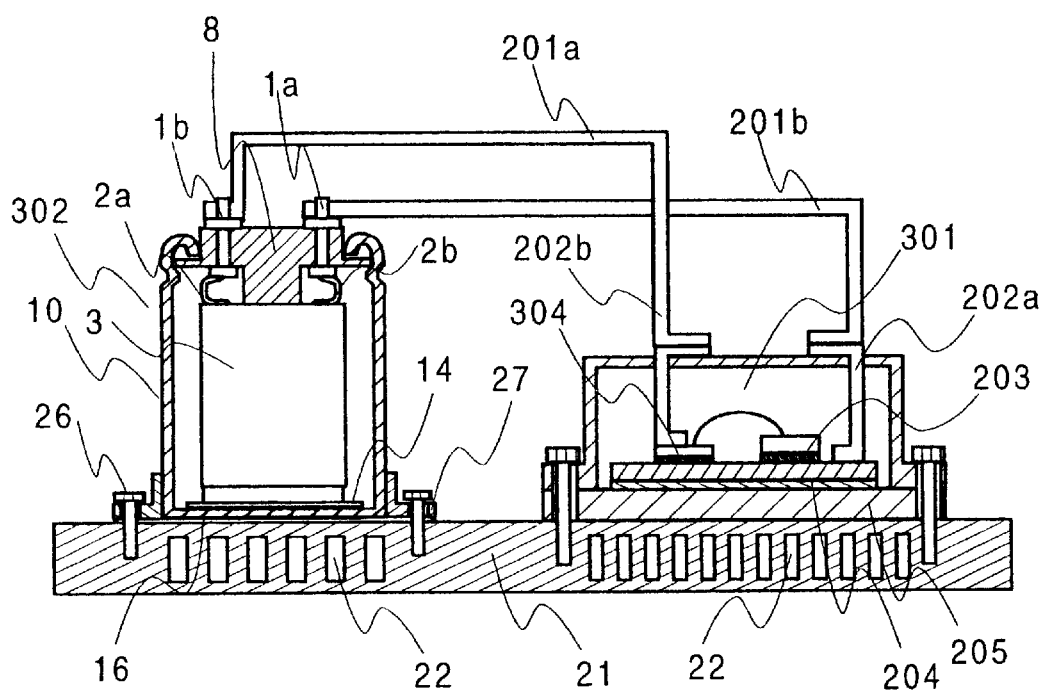
FIG. 9 is a cross-sectional view illustrating the construction of a power converter including the circuit of FIG. 8.

Since the semiconductor switching element 203 of the invertor circuit 301 exhibits a large heat generation density, highly efficient cooling is required, so that a liquid cooling mechanism is often employed as illustrated in FIG. 9. Specifically, the invertor circuit 301 is placed on an invertor cooling heat sink 21 in thermal contact therewith, and a flow path 22 is provided for cooling the capacitor 302 within the heat sink immediately below the invertor circuit 301. The capacitor 302, on the other hand, is placed on a portion of the heat sink 21 extended to one side in thermal contact therewith. With the construction as described, the heat sink 21 can be shared for cooling the invertor circuit 301 and the capacitor 302. In addition, since the semiconductor switching element 203 and the capacitor 302 are necessarily positioned close to each other, wires 201 of shorter lengths are only required to connect between anode terminals 1a, 202a and between cathode terminals 1b, 202b of the capacitor 302 and the invertor circuit 301, thus making it possible to simultaneously reduce inductance.

Figure 10:
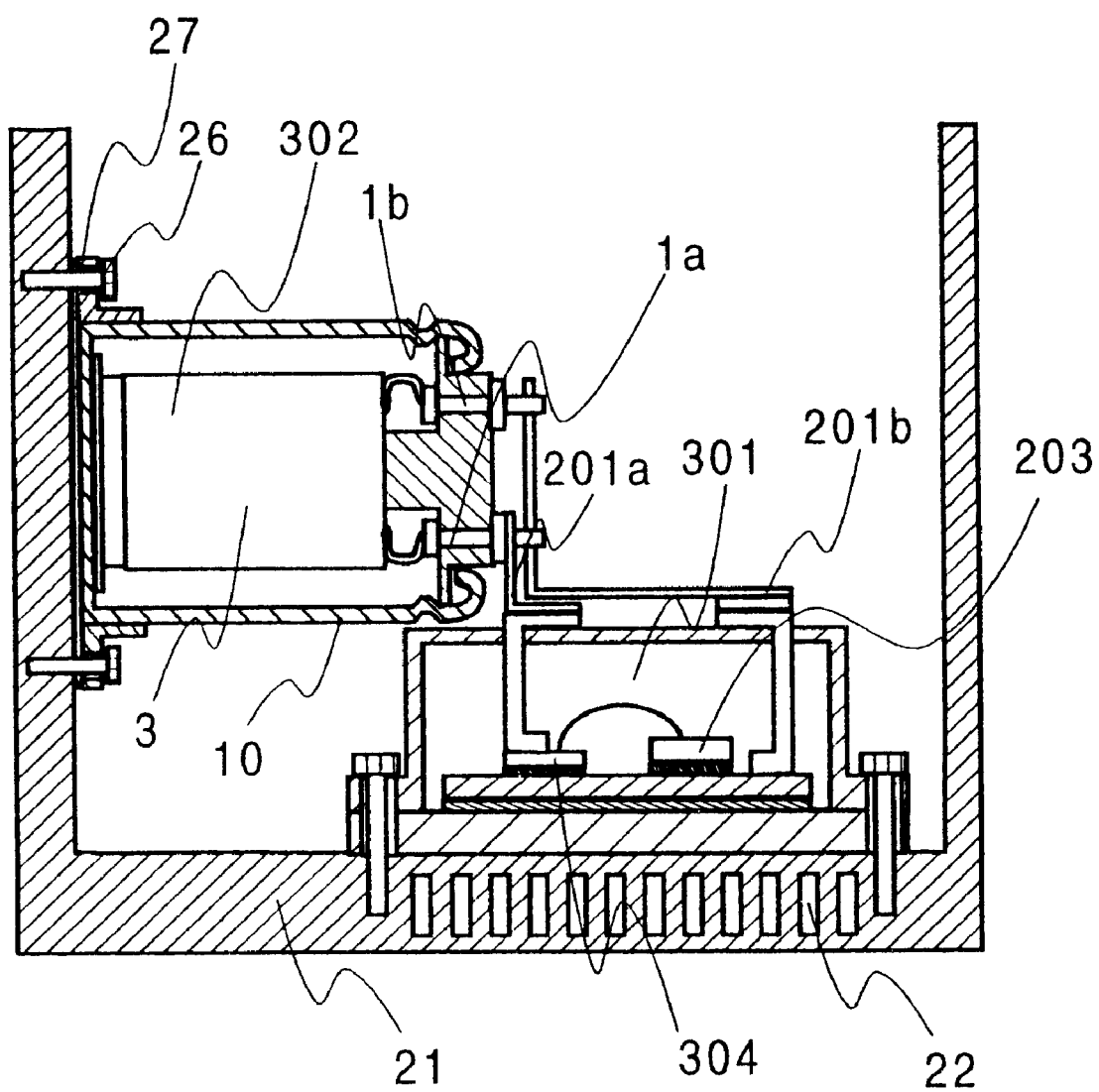
FIG. 10 is a cross-sectional view illustrating the construction of a second embodiment of the power converter according to the present invention.

Next, a second embodiment of the power converter according to the present invention will be described with reference to FIG. 10. FIG. 10 is a cross-sectional view illustrating the construction of a second embodiment of the power converter according to the present invention. In the second embodiment, a capacitor 302 is arranged in a horizontal orientation in thermal contact with a side wall surface of a heat sink 21 so that leading ends of electrode terminals 1a, 1b are closer to an invertor circuit 301 and electrically connected to the invertor circuit 301 through wires 201a, 201b. The bottom surface of the capacitor 302 is thermally connected to the surface of the side wall integrally formed with the liquid cooling heat sink 21 to ensure cooling performance. In addition, since the invertor circuit 301 is positioned closer to the capacitor 302 to reduce the lengths of the wires 201a, 201b, a reduction in inductance is also possible.

While in the foregoing discussions, the respective embodiments have been described with regard to an exemplary aluminum electrolytic capacitor as one form of a power storage device, the present invention can also be applied as it is to other power storage devices employing other types of capacitors, batteries, and so on, since the power storage devices generally have the same basic construction.

It is understood that the present invention may be implemented in a variety of other forms without departing from the spirit or principal features thereof. For this reason, the preferred embodiments of the present invention described in the above specification are merely illustrative but not limitative. The scope of the present invention is defined by the appended claims, and it is intended that all such modifications that fall under the meaning of the claims are encompassed by the present invention.

According to the present invention, it is possible to provide a power storage device which can prevent a leak current from flowing into a case to eliminate the generation of noise in the surroundings, which may cause radio wave interference, maintain the security during maintenance and inspection, and keep a power storage element at low temperatures to permit a longer effective life, a reduction in size, and a higher capacitance.

What is claimed is:

1. A power storage device comprising:
   a power storage element having an anode foil, a cathode foil, and an insulating sheet interposed therebetween, said power storage element being formed in a plurality of layers; and
   a case for accommodating said power storage element, said case having good thermal conductivity and electrical conductivity,
   wherein said power storage element has at least one electrode extended, a leading end of said extended electrode abutting to an electrically insulating member arranged on the bottom of said case, said electrically insulating member being formed of a highly thermally conductive and elastic material.

2. A power storage device according to claim 1, wherein said storage element is formed in a plurality of layers by piling and winding said anode foil, said cathode foil, and said insulating sheet interposed therebetween, and said electrically insulating member has a thickness of 1.1 mm or less.

3. A power storage device comprising:
   a power storage element having an anode foil, a cathode foil, and an insulating sheet interposed therebetween, said power storage element being formed in a plurality of layers by winding said anode foil, said cathode foil, and said insulating sheet a plurality of times;
   a metal case for accommodating said power storage element, said case having good thermal conductivity and electrical conductivity;
   a lid for covering one open surface of said case; and
   an electrically insulating member formed of a highly thermally conductive and elastic material, said electrically insulating member being disposed on the bottom of said case,
   wherein one end of said cathode foil is extended further than corresponding one end of said anode foil so that said one end of said cathode foil abuts to said electrically insulating member, and said power storage element is pressed onto said electrically insulating member by said lid.

4. A power converter comprising:
   a power storage device having a storage element and a case;
   an invertor circuit coupled to said power storage device as an input power supply for controlling the rotation of a motor,
   wherein said storage device is formed of an anode foil, a cathode foil, and an insulating sheet interposed therebetween and arranged in a plurality of layers, said case accommodates said power storage element and has good thermal conductivity and electrical conductivity, said power storage element has at least one of its electrodes being electrically insulated from said case and arranged in thermal contact with said case, and said power storage device and said invertor circuit are positioned in proximity, and
   a heat sink arranged in thermal contact with both said power storage device and said invertor circuit,
   wherein said heat sink is formed with a cooling fluid path at least in a portion thermally contacted with said invertor circuit and in a portion thermally contacted with said power storage device, and supplied with a cooling fluid from a side where said heat sink is thermally contacted with said invertor circuit.

5. A power converter comprising:
   a power storage device having a storage element and a case;
   an invertor circuit coupled to said power storage device as an input power supply for controlling the rotation of a motor, wherein said storage device is formed of an anode foil, a cathode foil, and an insulating sheet interposed therebetween and arranged in a plurality of layers, said case accommodates said power storage element and has good thermal conductivity and electrical conductivity, said power storage element has at least one of its electrodes being electrically insulated from said case and arranged in thermal contact with said case, and said power storage device and said invertor circuit are positioned in proximity, and a heat sink arranged in thermal contact with both said power storage device and said invertor circuit, wherein said power storage device is installed on a side wall surface adjacent to a bottom surface on which said invertor circuit is installed, and an electrode terminal arranged on one side of said power storage device is positioned in close proximity to said invertor circuit.

* * * * *

UNITED STATES PATENT AND TRADEMARK OFFICE
CERTIFICATE OF CORRECTION

PATENT NO.   : 6,021,040
DATED        : February 1, 2000
INVENTOR(S)  : Osama SUZUKI et al.

It is certified that error appears in the above-indentified patent and that said Letters Patent is hereby corrected as shown below:

On the title page, immediately under "[22] Filed: Nov. 13, 1998", please add the following:

--[30]  Foreign Application Priority Data
   Jan. 19, 1998 [JP] Japan........... 10-7454--

Signed and Sealed this

Ninth Day of January, 2001

Attest:

Q. TODD DICKINSON

*Attesting Officer*     *Commissioner of Patents and Trademarks*